United States Patent
Keesler et al.

(10) Patent No.: US 7,635,552 B2
(45) Date of Patent: Dec. 22, 2009

(54) PHOTORESIST COMPOSITION WITH ANTIBACTERIAL AGENT

(75) Inventors: Ross W. Keesler, Endicott, NY (US); John J. Konrad, Endicott, NY (US); Roy H. Magnuson, Endicott, NY (US); Robert A. Sinicki, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 503 days.

(21) Appl. No.: 11/492,029

(22) Filed: Jul. 25, 2006

(65) Prior Publication Data

US 2008/0026316 A1 Jan. 31, 2008

(51) Int. Cl.
*G03F 7/00* (2006.01)
*G03F 7/004* (2006.01)

(52) U.S. Cl. .................. 430/270.1; 430/311; 430/314; 430/905; 430/913; 430/926

(58) Field of Classification Search ............. 430/270.1, 430/311, 314, 913, 905, 926
See application file for complete search history.

(56) References Cited

U.S. PATENT DOCUMENTS

| | | | |
|---|---|---|---|
| 4,135,976 A | 1/1979 | Kitajima | |
| 4,775,585 A * | 10/1988 | Hagiwara et al. | 428/323 |
| 4,803,145 A * | 2/1989 | Suzuki et al. | 430/166 |
| 4,869,995 A | 9/1989 | Shirai et al. | |
| 4,898,656 A | 2/1990 | Hoshino et al. | |
| 5,077,179 A | 12/1991 | Abe et al. | |
| 5,206,119 A | 4/1993 | Kuse et al. | |
| 5,252,427 A | 10/1993 | Bauer et al. | |
| 5,384,229 A * | 1/1995 | Pai et al. | 430/270.1 |
| 5,627,010 A * | 5/1997 | Pai et al. | 430/270.1 |
| 5,670,261 A * | 9/1997 | Kameya et al. | 428/457 |
| 5,698,370 A | 12/1997 | Keil et al. | |
| 5,709,870 A | 1/1998 | Yoshimura et al. | |
| 5,942,371 A * | 8/1999 | Salvin et al. | 430/280.1 |
| 6,107,000 A | 8/2000 | Lee et al. | |
| 6,110,643 A | 8/2000 | Rath et al. | |
| 6,309,789 B1 * | 10/2001 | Takano et al. | 430/270.1 |
| 6,379,712 B1 | 4/2002 | Yan et al. | |
| 6,391,520 B1 | 5/2002 | Nakano et al. | |
| 6,485,735 B1 * | 11/2002 | Steen et al. | 424/423 |
| 6,503,691 B1 * | 1/2003 | Goodin et al. | 430/278.1 |
| 6,638,689 B1 | 10/2003 | Takahashi et al. | |
| 6,726,936 B1 | 4/2004 | Asano et al. | |
| 6,747,101 B2 * | 6/2004 | Roth et al. | 525/531 |
| 6,783,919 B2 | 8/2004 | Park et al. | |
| 7,011,923 B2 | 3/2006 | Li et al. | |
| 2006/0222845 A1 * | 10/2006 | Deng et al. | 428/336 |

* cited by examiner

*Primary Examiner*—Amanda C. Walke
(74) *Attorney, Agent, or Firm*—Hinman, Howard & Kattell; Lawrence R. Fraley; Mark Levy

(57) ABSTRACT

A photoresist composition, e.g., a positive acting resist, for use in the formation of circuit patterns and the like on printed circuit boards and the like circuitized substrates, the photoresist composition including a quantity of silver therein in a sufficient amount to substantially prevent bacteria formation within said composition. A method of making the composition is also provided.

23 Claims, No Drawings

PHOTORESIST COMPOSITION WITH ANTIBACTERIAL AGENT

TECHNICAL FIELD

The invention relates to photoresist compositions for use in the manufacture of circuitized substrates such as printed circuit boards and chip carriers.

BACKGROUND OF THE INVENTION

Various photoresist compositions are known in the art of producing printed circuit boards (hereinafter also referred to as PCB's), chip carriers and other circuitized substrate products. When exposed to activating radiation, the photoresist composition is chemically altered in its solubility to certain solvents (developers). Two types of photoresist (also referred to herein simply as "resist") compositions are known. One is referred to as a negative acting resist which is, generally, a composition which is soluble in the utilized developer but, following exposure to the actinic radiation, becomes less soluble in this developer, thereby defining a latent image. The second type of resist is known as the positive acting resist which works in an opposite fashion to the negative resist in that actinic radiation renders the resist more soluble in the developer. More description of both types is provided hereinbelow.

The above types of photoresist compositions generally comprise a light sensitive compound in a film-forming polymeric (resin) binder. One resin binder frequently used is an alkali soluble phenolic resin, e.g., cresol-formaldehyde resin. This material is the product of a reaction of cresol and formaldehyde under conditions whereby a thermoplastic (novolak) polymer is formed. Photoresist compositions prepared using the novolak type cresol formaldehyde resin typically incorporate therein a photoactive compound (also referred to as a sensitizer), e.g., one of the group of the 4- or 5-substituted naphthoquinone-1,2-diazidesulfonic acid esters. Examples of various photoresist compositions are provided below.

One photoresist composition used in the manufacture of PCB's is known as "PEPR 2400" photoresist, which is a positive acting waterborne resist (with negative charged micelles) sold by Rohm & Hass Electronic Materials (formerly Shipley Company and Ronel Inc.), having a location at 455 Forest Street, Marlborough, Mass. PEPR 2400 resist may be applied by electrodeposition and provides resolution to as low as five microns. Being a positive acting resist, the developed areas (an alkaline developer is preferably used) of the resist are removed, thereby exposing the defined pattern of the underlying metallurgy (typically a copper foil) on the desired substrate. Rinsing may be accomplished using deionized water and drying performed in a convection oven, e.g., at about 105 degrees Celsius (C). This particular photoresist has been successfully used by the Assignee of this invention to produce PCB's having high density circuit patterns, including those with tightly spaced plated-thru-holes (PTH's) therein. Such circuit patterns and PTH formations are required in many of today's leading PCB products.

More specific examples of various other photoresist compositions are described in the following U.S. Patents. Listing the following patents is not an acknowledgement that any are prior art to the present invention.

In U.S. Pat. No. 7,011,923, there is described a negative photoresist composition and a method of patterning a substrate through use of the composition. The negative composition comprises a radiation sensitive acid generator, a first polymer containing an alkoxymethyl amido group and a hydroxy-containing second polymer. The first and second polymers may also have a repeating unit having an aqueous base soluble moiety. The first and second polymers undergo acid catalyzed cross-linking upon exposure of the acid to radiation, producing a product that is insoluble in an aqueous alkaline developer solution.

In U.S. Pat. No. 6,638,689, there is described a photoresist composition including a photopolymerizable organic material, a water-soluble resin and an amino-group-containing resin, which is applied on the surface of a polyimide precursor layer to form a photoresist layer. Then, the layer is patterned by a photolithographic process. The polyimide precursor layer is etched and the pattern of the photoresist layer is transferred to the polyimide precursor layer. The amino-group-containing resin in the photoresist layer is combined with an acid anhydride in the polyimide precursor layer to attain good adhesion and high-accuracy etching without causing separation of the layer. Alternatively, a film can be formed from the photoresist composition and then applied on the surface of the polyimide precursor layer to form a photoresist layer.

In U.S. Pat. No. 6,110,643, there is described a process for fabricating a multilayer PCB with permanent inner layers of photoresist, the photo-imageable composition used to form the hard permanent layers comprising a polymerizable acrylate monomer, an oligomer formed by the reaction of an epoxy resin and an acrylic or methacrylic acid, a photosensitive, free radical generating initiator for polymerization of the acrylic monomer and oligomer, a curable epoxy resin, a curing agent for the epoxy resin, and, optionally, a crosslinking agent reactive with hydroxyl groups. After exposure and development of a layer of the photoimageable composition and etching of the underlying metal layer on a board, the resultant photoresist is left on the circuitry traces. The inner layers of photoresist are stacked in a press where it initially conforms under heat and pressure to fill voids between the inner layers, and then cures to permanence.

It is to be understood that the photoresist compositions of the present invention may also be retained as permanent inner layers of multilayered circuitized substrates of the type discussed in U.S. Pat. No. 6,110,643, if desired.

In U.S. Pat. No. 5,698,370, there is described a photoimageable composition, useful as a photoresist for forming a printed circuit board, which is alkaline aqueous developable but, subsequent to exposure and development, is processable in highly alkaline environments, such as additive plating baths and ammoniacal etchants. The photoimageable composition comprises between about 25 and about 75 wt % of a binder polymer, between about 20 and about 60 wt % of a photopolymerizeable material which is a multifunctional photopolymerizeable monomer or short chain oligomer, and between about 2 and about 20 wt % of a photoinitiator chemical system, the weight percentages being based on the total weight of these components. The improvement is the use in the photoimageable composition of a binder polymer which is a styrene/maleic anhydride copolymer in which the maleic anhydride residues are mono-esterified to between about 50 and about 65 mole percent of an alkyl, aryl, cycloalkyl, alkaryl, or arylalkyl alcohol having a molecular weight greater than 100, to between about 15 and about 50 mole percent of a $C_1$-$C_3$-alkyl alcohol, and to at least about 80 mole percent total. The polymer has between about 45 and about 65 mole percent styrene residues and between about 35 and about 55 mole percent maleic anhydride residues, a weight average molecular weight of between about 80,000 and about 200,000, and an acid number of between about 170 and about 220.

It is to be understood that the photoresist compositions of the present invention may include those of the photoimageable type, such as the one discussed in U.S. Pat. No. 5,698,370.

In U.S. Pat. No. 5,252,427, there is described an aqueous-processable, positive-working resist composition allegedly having improved photospeed and aqueous development rate without substantially reducing processing latitude in printed circuit chemistries. The composition includes a polymeric material having a polymer backbone with pendant acid labile groups which are bound directly or indirectly to the polymer backbone, and free acid groups, wherein the polymeric material has an acid number of about 25 and is substantially insoluble in 1% by weight aqueous sodium carbonate solution at 30 degrees Celsius (C). The composition further includes a substance that forms an acid upon exposure to actinic radiation. These photoresists may be applied as a liquid coating or from an electrodeposition bath.

In U.S. Pat. No. 4,898,656, there is described an electrodeposition coating process of photoresist for printed circuit board manufacture, the process involving electrodepositing on a conductive surface a photosensitive electrodeposition coating composition, and thereafter further electrodepositing on the resulting coating film an electrodeposition coating composition composed mainly of a water-soluble or water-dispersible resin having a glass transition temperature of at least 20.degree. C. The photosensitive electrodeposition coating composition is basically a composition containing as the main ingredients a resin having salt-forming groups for imparting solubility or dispersibility in water, and photosensitive groups.

In U.S. Pat. No. 4,869,995, there is described photosensitive resinous composition which includes a resin dissolved in an organic solvent, examples of the latter including glycol ethers such as ethyleneglycol monoethyl ether, ethylenegylcol monobutyl ether and the like, cellosolve acetates such as ethyleneglycol monomethyl ether acetate, ethyleneglycol monoethyl ether acetate and the like, aromatic hydrocarbons such as toluene, xylene and the like, ketones such as methyl ethyl ketone, cyclohexanone and the like, and esters such as ethyl acetate, butyl acetate and the like. The resinous composition is allegedly useful as a photosensitive material for resist and lithographic use. Since the photosensitive groups are incorporated in the resin molecule, the resin is claimed to exhibit a long-lasting photosensitivity and excellent stability. As the exposing light, various actinic radiations having absorption maximum at different level in about 200 to 400 nm range may be selected and a particularly high contrast image can be obtained with relatively shorter wave length radiations. The authors claim that the composition is useful in the production of resist material for printed circuit boards.

It is to be understood that the teachings of the present invention are applicable to both positive and negative acting photoresist compositions, including the described PEPR 2400 resist. However, the invention is not limited to a particular resist composition, whether positive or negative acting, but may be successfully utilized in many compositions, including those of other types such as discussed above.

It has been learned that certain forms of bacteria may become present in the photoresist composition while in its liquid form, prior to deposition on the desired substrates, and that this bacteria has attacked the photoinitiator(s) present in the composition over a period of time (e.g., during composition storage), thereby limiting the functional bath life of the liquid resist. Because photoresist compositions such as the aforementioned PEPR 2400 resist are considered relatively expensive (especially in comparison to resists with lesser functional capabilities), the problems associated with such bacteria presence can prove to be costly to the PCB manufacturer.

It is believed, therefore, that a new photoresist composition which includes as part thereof means for destroying and/or preventing bacterial growth within the composition will represent a significant advancement in the art. It is especially believed that a composition including such means which is capable of being exposed in such a manner as to enable the formation of high density circuit patterns would constitute a particularly valuable art contribution.

OBJECT AND SUMMARY OF THE INVENTION

It is, therefore, a primary object of the present invention to provide a new and improved photoresist composition capable of being used in the manufacture of circuitized substrates such as PCB's and chip carriers.

It is also a primary object of the invention to provide such a composition which is capable of destroying and/or preventing further growth of bacteria within the composition for a predetermined time period sufficient to enable the composition user to satisfactorily utilize the composition to manufacture circuitized substrates when desired.

It is another object of the invention to provide such a composition which is adaptable to mass production manufacture of such substrates while also assuring exposure of the substrate's metallurgy so as to result in the formation of high density circuit patterns thereon.

It is yet another object of the invention to provide such a composition which is not significantly more expensive that some known photoresists and possibly less expensive than many.

According to one aspect of the invention, there is provided a photoresist composition for use in the formation of circuit patterns and the like on printed circuit boards, said photoresist composition including a quantity of silver therein in a sufficient amount to substantially prevent bacteria formation within said composition.

According to another aspect of the invention, there is provided a method of making a photoresist composition for use in the formation of circuit patterns and the like on circuitized substrates, said method comprising providing a photoresist composition and adding a quantity of silver to the photoresist composition in a sufficient amount to substantially prevent bacteria formation within the composition for a predetermined time period.

According to still another aspect of the invention, there is provided a method of making a circuitized substrate which comprises providing a substrate having a layer of conductor thereon, providing a quantity of liquid photoresist composition, adding a quantity of silver to the liquid photoresist composition in a sufficient amount to substantially prevent bacteria formation within the liquid photoresist composition, depositing a layer of the liquid photoresist composition on the layer of conductor, heating the layer of liquid photoresist to substantially solidify it, thereafter exposing the photoresist, thereafter developing the photoresist to remove part of the photoresist and thereby expose selected areas of the layer of conductor, thereafter etching these exposed areas of conductor to remove selected portions thereof and define a circuit pattern on the substrate, and thereafter removing the remaining portions of the photoresist from the substrate.

BEST MODE FOR CARRYING OUT THE INVENTION

For a better understanding of the present invention, together with other and further objects, advantages and capabilities thereof, reference is made to the following disclosure and appended claims.

By the term "bacteria" as used herein is meant to include organisms capable of attacking the photoinitiators used in photoresist compositions.

By the term "photoresist composition" as used herein is meant to include light sensitive materials used in photolithographic processing to form patterned coatings on the surfaces of printed circuit board conductive (e.g., copper) layers to subsequently define the circuit patterns and the like (e.g., solder ball pads) for said layers. As mentioned above, examples of such photoresists may be classified into two groups: (1) positive resists, in which the exposed areas become more sensitive to chemical etching and are removed in the developing process; and (2) negative resists, in which the exposed areas become resistant to chemical etching such that the unexposed areas are removed during the developing process. As also mentioned above, it is believed that the teachings herein are applicable to photoimageable and other resists.

One example of a photoresist composition adapted for use herein as the aforementioned "PEPR 2400" resist, sold by aforementioned Rohm and Haas. This composition is a positive acting waterborne resist with negative charged micelles and includes the following elements in approximate percentages (by weight): (1) water—greater than 70 percent; (2) methyl n-hexyl ketone—less than 5 percent; (3) triethanolamine—less than 1 percent; (4) 1-methyl-2-pyrrolidinone—less than 3 percent; (5) diazo photo-active compound—less than 5 percent; (6) dye compound—less than 1 percent; and (7) an acrylic copolymer—less than 20 percent.

Understandably, the photoresist compositions of the present invention are particularly adapted for use in photolithographic processing (photolithography) used in the manufacture of circuitized substrates such as printed circuit boards and chip carriers. As is known, photolithographic processing involves the transferring of a pattern of geometric shapes on a mask to a substrate. The mask may be a glass plate containing a pattern (e.g., a chromium pattern) of transparent and opaque regions to define the geometrical shapes. Given such a substrate, a layer of photoresist is applied to an exterior surface of the substrate such as by spin coating or the like. As mentioned above, generally speaking, there are two types of photoresist (or, simply resist) compositions: positive and negative. Positive resists are insoluble in a developer solution, whereas negative resists are soluble in a developer solution.

For positive resists, such as the aforementioned "PEPR 2400" resist composition, the resist is typically exposed with ultraviolet (UV) light. The UV light is propagated through the mask and onto the substrate, wherever the underlying material is to be removed. Exposure to the UV light changes the chemical structure of the resist so that it becomes soluble in a developer solution. The exposed resist is then selectively "washed away" by the developer solution, leaving isolated regions of the unexposed resist. The mask, therefore, contains an exact copy of the geometric pattern which is to remain on the substrate.

As also mentioned, the teachings herein are also adaptable to negative resists. Such resists behave in an opposite manner to positive resists because exposure to the UV light (also typically utilized for exposure) initiates a cross-linking reaction which causes the negative resist to become polymerized with a consequent significant increase in molecular weight of the reaction product (compared with the molecular weight of the unexposed resist). The increase in molecular weight results in the reaction product being insoluble in the developer solution. The cross-linking reaction may be acid catalyzed, and the negative resist may accordingly include an acid generator that generates acid upon exposure to the UV light. Thus, the negative resist remains on the surface of the substrate wherever it is exposed, and the developer solution removes only the unexposed portions. Masks used for negative photoresists, therefore, contain the inverse of the geometric pattern to be transferred.

Finally, it is believed that the teachings herein are also applicable to other than negative or positive acting resists, including, for example, photoimageable resist compositions.

In one embodiment of the invention, there is provided a photoresist composition comprised of the foregoing PEPR 2400 resist composition elements and from about 100 parts per billion (PPB) to about 300 PPB of silver, this amount deemed sufficient to prevent significant bacteria growth within the composition for a predetermined time period during which the composition may be stored prior to utilization in the manufacture of a circuitized substrate. In a more specific embodiment, about 190 PPB of silver from a silver nitrate solution is added to the PEPR resist composition in a tank having side walls and in which a known (to PCB manufacture) electrodeposition process is utilized while the substrates (some often referred to simply as "panels") are immersed therein. In a more particular embodiment, three tanks are utilized, the first considered a resist tank, having the above resist composition therein, and the other two considered rinse tanks in which the substrate having resist thereon is then subjected to two rinsing steps (here, immersion also) to remove the undesirable amounts of resist from the substrate prior to the next steps.

In the above embodiment, the silver is added from a silver nitrate solution in which approximately 47 milliliters (ml) of the solution are added to the resist tank in which about 190 gallons of the resist composition is held. One example of such a silver nitrate solution is known in the industry as "0.0141 N Silver Nitrate Solution" (0.24% wt/wt silver nitrate dissolved in water), which is available from Fisher Scientific, having a business location at 2000 Park Lane, Pittsburgh, Pa. 47 ml 0.0141 N silver nitrate is equivalent to 71,500 micrograms of silver. The final silver concentration in the resist composition is 99 micrograms silver per liter. Additional silver is provided as needed to maintain its effectiveness within the respective composition.

In one embodiment of the invention, two rinse tanks are also used in addition to the main resist tank containing the liquid photoresist. The substrates receiving the liquid photoresist are dipped (immersed) within the first resist tank and electrodeposition utilized to apply the desired coating over the substrate's conductor (more of this is defined below). The substrates are then removed and immersed within the first rinse tank, followed by immersion in the second rinse tank. Each of the three tanks will include amounts of silver therein, all from the described silver nitrate solution. In the main resist tank, the aforedefined 47 ml is deposited in the 190 gallons. In each of the two rinse tanks, a total of 24 ml of silver is deposited, each of said tanks contain a total of 90 gallons of solution. The primary rinse solution is water.

When the substrates are removed from each tank, a certain amount of liquid drips off from these, this drip material referred to as "dragout." The substrates are suspended above the respective a predetermined time period to minimize "dragout" into the following tank. In the case of the main resist tank, this time period is about eight seconds while in each of the rinse tanks, the time period is about four seconds.

Importantly, the amount of silver in each tank is reduced as part of the coating process, requiring replenishment over time. In one example, it was necessary to add 30 ml of silver to the main resist tank after 72 hours of resist deposition, and also to add 20 ml to each of the rinse tanks. Of further importance, minor quantities of the silver in the resist tank are carried over into the first rinse tank by the substrates having resist thereon, and silver is likewise carried over into the second rinse tank by substrates moving from rinse tank to rinse tank. Hence, the need to replenish at the amounts cited. It has been determined that a total number of 330 substrates were deposited with the resist over this period of time, thereby indicating the approximate amount of silver needed to retain the level desired in the tanks.

Prior to resist electrodeposition, it may be desirable to store the liquid resist material within the main resist tank (e.g., between work shifts, over the weekend, etc.). In one example, where 47 ml of silver nitrate solution was added to the 190 gallon tank of PEPR 2400 resist, a total of 11,000 cfu/ml of bacteria was measured before the silver addition and less than 10 cfu/ml after only 3 hours following silver addition. This same low level of bacteria was measured after 13 days of storage, without the addition of any more silver nitrate solution. In resist compositions not including the added silver, the bacteria count ranged from the defined 11,000 cfu/ml to as high as 290,000 cfu/ml on day two of the storage. It is clearly seen that the addition of the silver in the amounts indicated successfully reduced the total bacteria count for an acceptable period adaptable to production.

One example of such a substrate may be a single dielectric layer (e.g., comprised of conventional "FR-4" epoxy resin reinforced with glass fiber) having a single metal (e.g., copper or copper alloy) layer thereon. The dielectric layer in this example may have a thickness of about 0.1 mm while the copper may have a thickness of about 0.0325 mm. Both sides of the dielectric may include the copper conductor layer thereon. Understandably, the teachings herein are adaptable to substrates wherein the dielectric may be in the form of more than one layer, including where the substrate has several such layers and a corresponding number of internal conductor layers. If a single dielectric-conductor layer(s) "sub-composite" is formed, this in turn may have added dielectric layers bonded (e.g., laminated) to the exterior surfaces thereof and added conductor layers positioned thereon (e.g., also using lamination). These subsequently applied conductor layers may then in turn be subjected to the following steps in order to form desired circuit patterns therein.

The substrate with the conductor layer(s) thereon is first preferably exposed to a cleaning step in which the conductor is cleaned and degreased, if such is necessary (typically necessary in handling of conventional conductor layers on most known substrates). Such cleaning may comprise applying acid (e.g., "Preposit Spray Cleaner 742", from Rohm and Haas) to the conductor for a time period of about 120 seconds and thereafter rinsing the exposed surfaces (e.g., with dionized water). A microetching step may then occur in which the copper's desired topography is established. This also involves application of a suitable acid (e.g., "Preposit Etch 748", also from Rohm and Haas), this time for a period of 120 seconds, followed again by a rinse (e.g., dionized water again).

The next steps involve the applying of the above liquid photoresist to the layer(s) of conductor. At least one, and preferably two, thin coatings of the liquid photoresist are applied, each subjected to the aforementioned electrodeposition such that extremely thin (e.g., 4 to 8 microns) thicknesses are attained. This occurs within the main resist tank defined above, following which the two rinses defined above occur. The substrates are then subjected to air "blow off" in which air is blown onto the substrates, drying same. The substrates are then placed in a convection oven, heated, and thus dried. The resist coating is now hardened and ready for further processing.

In the next step, the resist on the substrates is exposed using appropriate artwork (one example discussed above), using ultraviolet (UV) light at 800 mJ/square centimeter of resist at 6 micron thickness. This is understandably an example and not limiting of the invention, as other exposure rates and levels may be used, depending on the resist compositions, thicknesses, etc.

The exposed resist is now developed using conventional development processing. In one example, sodium hydroxide solution (e.g., one example being referred to as "0.8% NaOH (0.2N)" available from Fisher Scientific, having a business location at 2000 Park Lane Pittsburgh, Pa.) is used. This is a known procedure and further description is not deemed necessary.

The substrates are then etched using a conventional cupric chloride etchant in which the exposed copper conductor layer is etched and the copper so treated removed. Following this, the resist is stripped using a conventional sodium hydroxide stripper, one example of this being a 1% NaOH solution, also available from Fisher Scientific.

The conductor layers of the substrates are now what could be referred to as circuitized and ready for use, including, as stated above, stacking up and laminating to other such substrates (sometimes referred to as subcomposites in the PCB industry).

Thus there has been described the use of a specified material (silver) to prevent growth of unacceptable amounts of bacteria within a liquid photoresist solution such that the solution may be successfully utilized to apply thin coatings of resist on substrates for eventual use as printed circuit boards, chip carriers and the like circuitized substrates. The result of such usage is a savings in resist material, and thus a savings in the cost of manufacture of such substrates. The invention is also usable with conventional manufacturing equipment, thereby further saving costs. Other advantageous features are discernible from the teachings herein.

While there have been shown and described what are at present the preferred embodiments of the invention, it will be obvious to those skilled in the art that various changes and modifications may be made therein without departing from the scope of the invention as defined by the appended claims

What is claimed is:

1. A photoresist composition for use in the formation of circuit patterns on circuitized substrates, said photoresist composition including a quantity of silver therein in an amount of from about 100 parts per billion (PPB) of said composition to about 300 PPB of said composition to substantially prevent bacteria formation within said composition for a predetermined time period.

2. The photoresist composition of claim 1 wherein said quantity of silver is about 190 PPB of said composition.

3. The photoresist composition of claim 1 wherein said photoresist composition is a negative acting photoresist.

4. The photoresist composition of claim 1 wherein said photoresist composition is a positive acting photoresist.

5. The photoresist composition of claim 4 wherein said photoresist composition comprises, in addition to said quantity of silver, water, methyl n-hexyl ketone, triethanolamine, 1-methyl-2-pyrrolidinone, diazo photo-active compound, a dye compound, and an acrylic copolymer.

6. The photoresist composition of claim 5 wherein said water comprises less than about 70% of said composition, said methyl n-hexyl ketone comprises less than about 5% of said composition, said triethanolamine comprises less than about 1% of said composition, said 1-methyl-2-pyrrolidinone comprises less than about 3% of said composition, said diazo photo-active compound comprises less than about 5% of said composition, said dye compound comprises less than about 1% of said composition, and said acrylic copolymer comprises less than about 20% of said composition.

7. The photoresist composition of claim 5 wherein said quantity of silver is within the range of from about 100 PPB of said composition to about 300 PPB of said composition.

8. The photoresist composition of claim 7 wherein said quantity of silver is about 190 PPB of said composition.

9. A method of making a photoresist composition for use in the formation of circuit patterns on circuitized substrates, said method comprising:
   providing a photoresist composition; and
   periodically adding a quantity of silver to said photoresist composition in an amount of between about 100 PPB of said composition to about 300 PPB of said composition to substantially prevent bacteria formation within said composition for a predetermined time period.

10. The method of claim 9 wherein said photoresist composition is provided as a negative acting photoresist composition.

11. The method of claim 9 wherein said photoresist composition is provided as a positive acting photoresist composition.

12. The method of claim 9 wherein said quantity of silver is added to said photoresist composition so as to comprise about 190 PPB of said composition.

13. A method of making a circuitized substrate, said method comprising:
   providing a substrate having a layer of conductor thereon;
   providing a quantity of liquid photoresist composition;
   adding a first quantity of silver to said liquid photoresist composition in a sufficient amount to substantially prevent bacteria formation within said liquid photoresist composition;
   periodically adding a second quantity of silver as a function of bacteria growth;
   depositing a layer of said liquid photoresist composition on said layer of conductor on said substrate;
   heating said layer of liquid photoresist to substantially solidify said photoresist;
   thereafter exposing said photoresist on said layer of conductor;
   thereafter developing said photoresist on said layer of conductor to remove part of said photoresist and thereby expose selected areas of said layer of conductor;
   thereafter etching said exposed areas of said layer of conductor to remove selected portions of said layer and define a circuit pattern on said substrate; and
   thereafter removing the remaining portions of said photoresist from said substrate.

14. The method of claim 13 wherein said depositing of said layer of said liquid photoresist composition on said layer of conductor of said substrate is accomplished using electrodeposition.

15. The method of claim 13 wherein said quantity of silver is added to said liquid photoresist composition at an amount of from about 100 PPB to about 300 PPB.

16. The method of claim 15 wherein said quantity of silver is added to said liquid photoresist composition at an amount of about 190 PPB.

17. The method of claim 13 wherein said photoresist composition is provided within a tank having walls and said quantity of said silver is added to said photoresist composition while said photoresist composition is within said tank.

18. The method of claim 17 further including conditioning said walls of said tank prior to said providing of said photoresist composition within said tank.

19. The method of claim 18 wherein said conditioning comprises substantially filling said tank with a composition of water and silver and thereafter draining said tank.

20. The method of claim 19 wherein said silver in said composition of said water and silver comprises about 100 PPB of said composition of water and silver.

21. The method of claim 13 wherein said heating of said layer of liquid photoresist to substantially solidify said photoresist comprises positioning said substrate having said photoresist composition thereon within a convection oven.

22. The method of claim 13 wherein said exposing of said photoresist on said layer of conductor comprises exposing said photoresist to UV radiation.

23. The method of claim 13 wherein said developing of said photoresist on said layer of conductor to remove part of said photoresist and thereby expose selected areas of said layer of conductor comprises depositing a developer solution onto said photoresist.

\* \* \* \* \*